US009893135B2

(12) United States Patent
Jin et al.

(10) Patent No.: US 9,893,135 B2
(45) Date of Patent: Feb. 13, 2018

(54) ORGANIC LIGHT EMITTING DIODE DISPLAY

(71) Applicant: SAMSUNG DISPLAY CO., LTD., Yongin, Gyeonggi-Do (KR)

(72) Inventors: Guang Hai Jin, Seoul (KR); Jae Beom Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/720,691

(22) Filed: May 22, 2015

(65) Prior Publication Data

US 2016/0104755 A1 Apr. 14, 2016

(30) Foreign Application Priority Data

Oct. 8, 2014 (KR) .......................... 10-2014-0136206

(51) Int. Cl.
*H01L 27/32* (2006.01)

(52) U.S. Cl.
CPC ...... *H01L 27/3262* (2013.01); *H01L 27/3276* (2013.01); *H01L 2227/323* (2013.01)

(58) Field of Classification Search
CPC ............. H01L 27/3262; H01L 27/3276; H01L 27/3265; H01L 27/3248
See application file for complete search history.

(56) References Cited

U.S. PATENT DOCUMENTS

| 6,791,632 B2* | 9/2004 | Lee ................... G02F 1/136204 349/40 |
| 8,390,638 B2* | 3/2013 | Chiou .................. G09G 3/3233 345/581 |
| 2001/0015465 A1* | 8/2001 | Lee ................... H01L 21/76224 257/394 |
| 2008/0231165 A1* | 9/2008 | Lee ......................... H01J 29/92 313/495 |
| 2013/0134423 A1 | 5/2013 | Jin et al. |

FOREIGN PATENT DOCUMENTS

| JP | 2009-128520 A | 6/2009 | |
| KR | 10-0466628 B1 | 1/2005 | |
| KR | 1020060089638 | * 9/2006 | ............. H05B 33/00 |
| KR | 10-0805155 B1 | 2/2008 | |
| KR | 10-1511138 B1 | 4/2015 | |

* cited by examiner

*Primary Examiner* — Kyoung Lee
*Assistant Examiner* — Christina Sylvia
(74) *Attorney, Agent, or Firm* — Lewis Roca Rothgerber Christie LLP

(57) ABSTRACT

An organic light emitting diode display includes: a substrate; a first thin film transistor including a first active region on the substrate; a second thin film transistor connected to the first thin film transistor and including a second active region spaced from the first active region; and a silicon layer on the substrate and including a plurality of polysilicon lines spaced from each other and extending in a first direction and a plurality of amorphous silicon lines between the adjacent polysilicon lines and extending in the first direction, wherein the first active region and the second active region are in different polysilicon lines of the plurality of polysilicon lines.

17 Claims, 11 Drawing Sheets

ORGANIC LIGHT EMITTING DIODE DISPLAY

CROSS-REFERENCE TO RELATED APPLICATION

This application claims priority to and the benefit of Korean Patent Application No. 10-2014-0136206 filed in the Korean Intellectual Property Office on Oct. 8, 2014, the entire contents of which are incorporated herein by reference.

BACKGROUND

1. Field

Embodiments of the present invention relate to an organic light emitting diode display and a manufacturing method of an organic light emitting device. Further, embodiments of the present invention relate to an organic light emitting diode display including a plurality of thin film transistors, and a manufacturing method of an organic light emitting diode display.

2. Description of the Related Art

In general, representative examples of a flat panel display include an organic light emitting diode display, a liquid crystal display, a plasma display panel, and the like.

Among them, the organic light emitting diode display includes a plurality of thin film transistors. The plurality of thin film transistors respectively includes an active layer formed of polysilicon.

Each active layer includes a plurality of thin film transistors patterned to be spaced from each other to prevent an undesired current from flowing therebetween.

The above information disclosed in this Background section is only for enhancement of understanding of the background of the present invention and therefore it may contain information that does not form prior art.

SUMMARY

An exemplary embodiment of the present invention provides an organic light emitting diode display in which each active layer including a plurality of thin film transistors is not patterned, and a manufacturing method thereof.

Further, an organic light emitting diode display in which a current is prevented or substantially prevented from flowing between adjacent active layers respectively included in adjacent thin film transistors although the active layer is not patterned and a manufacturing method thereof are provided.

In addition, an organic light emitting diode display with a reduced manufacturing time and manufacturing cost without the patterning of the active layer and a manufacturing method thereof are provided.

An embodiment of the present invention provides an organic light emitting diode display including: a substrate; a first thin film transistor including a first active region on the substrate; a second thin film transistor connected to the first thin film transistor and including a second active region spaced from the first active region; and a silicon layer on the substrate and including a plurality of polysilicon lines spaced from each other and extending in a first direction and a plurality of amorphous silicon lines between the adjacent polysilicon lines and extending in the first direction, wherein the first active region and the second active region are formed in different polysilicon lines of the plurality of polysilicon lines.

The plurality of polysilicon lines and the plurality of amorphous silicon lines may form one silicon layer.

The plurality of polysilicon lines and the plurality of amorphous silicon lines may be integrally formed.

The amorphous silicon lines may connect adjacent polysilicon lines.

The plurality of polysilicon lines may include: a first polysilicon line formed with the first active region; and a second polysilicon line spaced from the first polysilicon line with the amorphous silicon line interposed therebetween and formed with the second active region.

The first active region may include: a first source region and a first drain region spaced from each other and doped with an impurity; and a first channel region between the first source region and the first drain, region.

The second active region may include: a second source region and a second drain region spaced from each other and doped with the impurity; and a second channel region between the second source region and the second drain region.

The first thin film transistor may further include a first gate electrode on the first channel region, and the second thin film transistor may further include a second gate electrode on the second channel region and connected to the first drain region.

The first gate electrode and the second gate electrode may respectively extend in a second direction crossing the first direction.

A scan line on the first polysilicon line and the adjacent amorphous silicon line, extending in the first direction, and connected to the first gate electrode may be further included.

A data line on the silicon layer, extending in the second direction, and connected to the first source region may be further included.

A driving power source line on the silicon layer, extending in the second direction, and connected to the second source region may be further included.

A capacitor including a first capacitor electrode connected to the second gate electrode and a second capacitor electrode on the first capacitor electrode with the insulating layer therebetween and the second capacitor electrode is connected to the driving power source line may be further included.

The first capacitor electrode may be formed of the same or substantially the same material as the second gate electrode, and the second capacitor electrode may be formed of the same or substantially the same material as the driving power source line.

The plurality of polysilicon lines may be formed of polysilicon generated from amorphous silicon using a laser.

An organic light emitting element connected to the second thin film transistor may be further included.

The organic light emitting element may include: a first electrode connected to the second thin film transistor; an organic emission layer on the first electrode; and a second electrode on the organic emission layer.

Also, another embodiment of the present invention provides a manufacturing method of an organic light emitting diode display including: forming an amorphous silicon layer on a substrate; irradiating a laser on to the amorphous silicon layer to form a silicon layer including a plurality of polysilicon lines spaced from each other and extending in a first direction and a plurality of amorphous silicon lines between the adjacent polysilicon lines and extending in the first direction; respectively forming a first active region and a second active region in the different polysilicon lines among the plurality of polysilicon lines; and forming a first thin film transistor including the first active region and a second thin film transistor including the second active region.

The patterning of the amorphous silicon layer may not be performed in the forming of the silicon layer.

The plurality of polysilicon lines and the plurality of amorphous silicon lines may be integrally formed in the forming of the silicon layer.

According to the described exemplary embodiments of the present invention, the organic light emitting diode display in which each active layer of a plurality of thin film transistors is not patterned and the manufacturing method thereof are provided.

Further, although the active layer is not patterned, the organic light emitting diode display in which the current is prevented or substantially prevented from flowing between the adjacent active layer included in the thin film transistors and the manufacturing method thereof are provided.

In addition, by omitting the patterning of the active layer, the organic light emitting diode display with the reduced manufacturing cost and manufacturing time and the manufacturing method thereof are provided.

DETAILED DESCRIPTION

Figure 1:
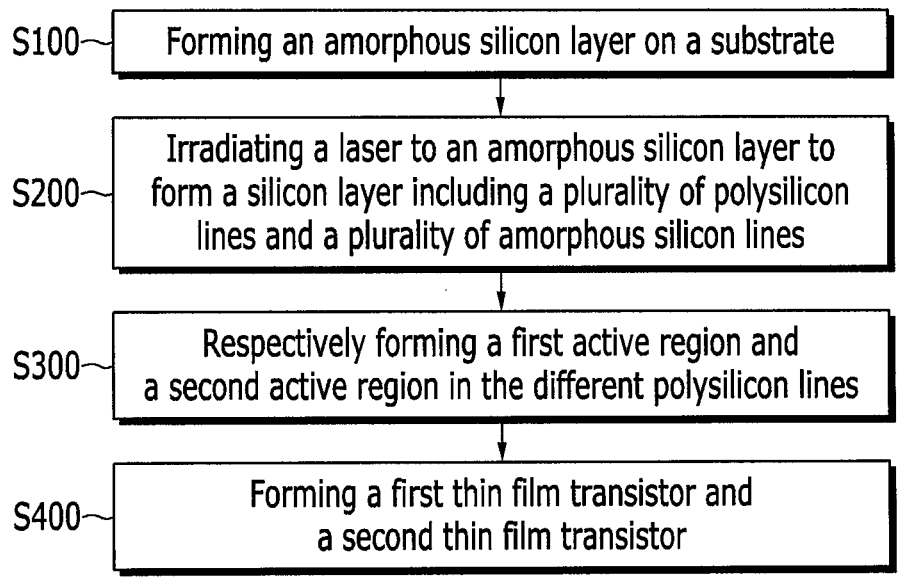
FIG. 1 is a flowchart showing a manufacturing method of an organic light emitting diode display according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

Further, in the exemplary embodiments, since like reference numerals designate like elements having the same or substantially the same configuration, a first exemplary embodiment is representatively described, and in other exemplary embodiments, different configurations from the first exemplary embodiment will be described.

In the drawings, size and thickness of each element are arbitrarily illustrated for convenience of description, and the present invention is not necessarily limited to the relative dimensions as illustrated in the drawings.

In the drawings, the thickness of layers, films, panels, regions, etc., are exaggerated for clarity. In the drawings, the thicknesses of layers and regions are exaggerated for convenience of description. It will be understood that when an element such as a layer, film, region, or substrate is referred to as being "on" another element, it can be directly on the other element or intervening elements may also be present.

In addition, unless explicitly described to the contrary, the words "comprise" and "include" as well as variations such as "comprises," "comprising," "includes," and "including" will be understood to imply the inclusion of stated elements but not the exclusion of any other elements. Further, in the specification, the word "on" means positioning on or below the object portion, but does not essentially mean positioning on the upper side of the object portion based on a gravity direction.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the present invention.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. §112, first paragraph, and 35 U.S.C. §132(a).

In addition, it will also be understood that when a layer is referred to as being "between" two layers, it can be the only layer between the two layers, or one or more intervening layers may also be present.

The terminology used herein is for the purpose of describing particular embodiments only and is not intended to limit the present invention. As used herein, the singular forms "a" and "an" are intended to include the plural forms as well, unless the context clearly indicates otherwise. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be directly on, connected to, coupled to, connected with, coupled with, or adjacent to the other element or layer, or one or more intervening elements or layers may be present. In contrast, when an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. As used herein, the terms "use," "using," and "used" may be considered synonymous with the terms "utilize," "utilizing," and "utilized," respectively.

The organic light emitting diode display and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the organic light emitting diode display may be formed on one integrated circuit (IC) chip or on separate IC chips. Further, the various components of the organic light emitting diode display may be implemented on a flexible printed circuit film, a tape carrier package (TCP), a printed circuit board (PCB), or formed on a same substrate as the organic light emitting diode display. Further, the various components of the organic light emitting diode display may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Next, a manufacturing method of an organic light emitting diode display according to an exemplary embodiment of the present invention will be described referring to FIG. 1 through FIG. 11.

FIG. 1 is a flowchart showing a manufacturing method of an organic light emitting diode display according to an exemplary embodiment of the present invention. FIG. 2 through FIG. 11 are views of a manufacturing method of an organic light emitting diode display according to an exemplary embodiment of the present invention. FIG. 2 through FIG. 11 are the views showing a portion of the organic light emitting diode display for convenience of description, and for example, the portion may be a pixel (e.g., a minimum unit for displaying an image).

Figure 2:
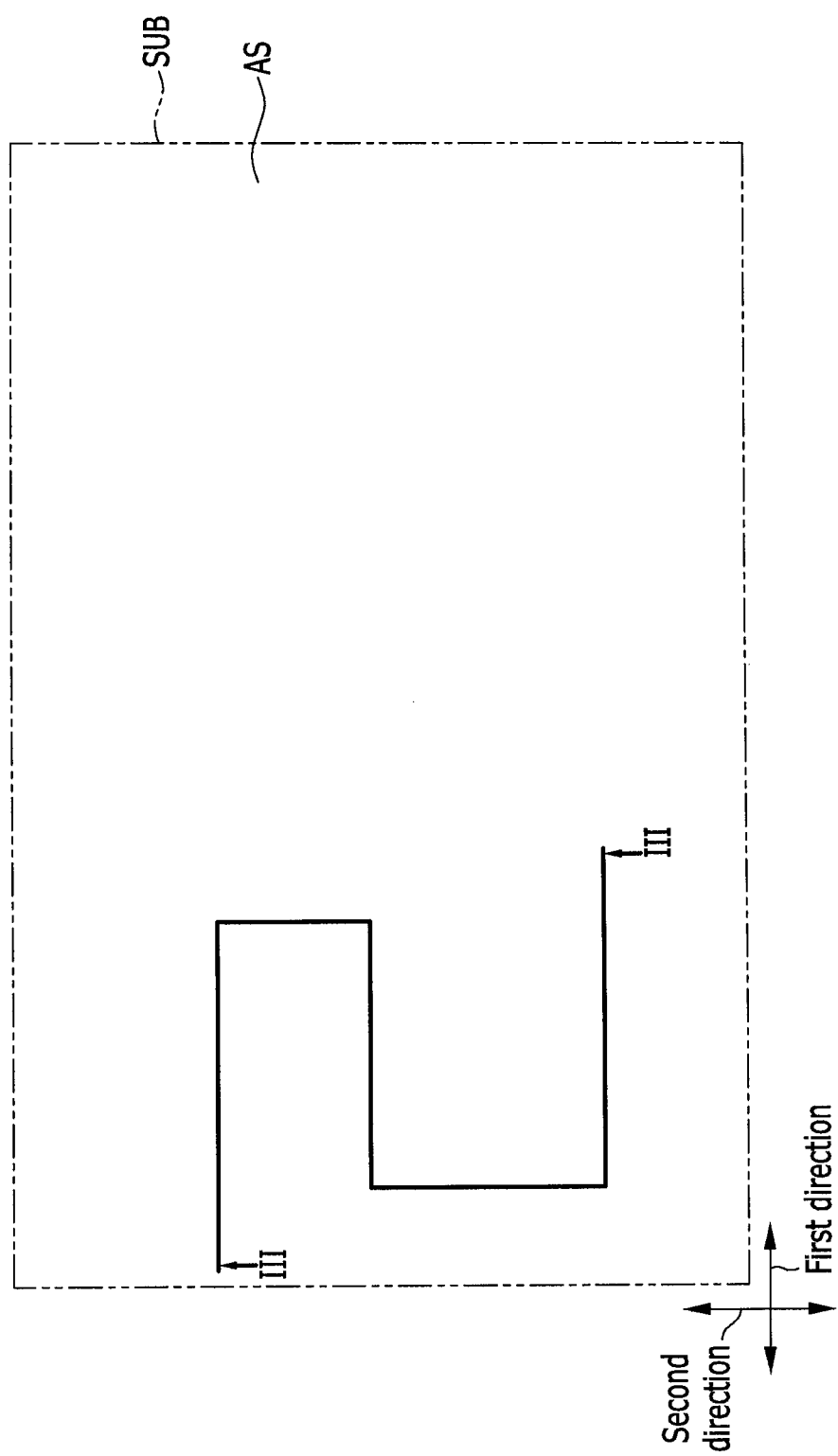
FIG. 2 through FIG. 11 are views of a manufacturing method of an organic light emitting diode display according to an exemplary embodiment of the present invention.
Figure 3:
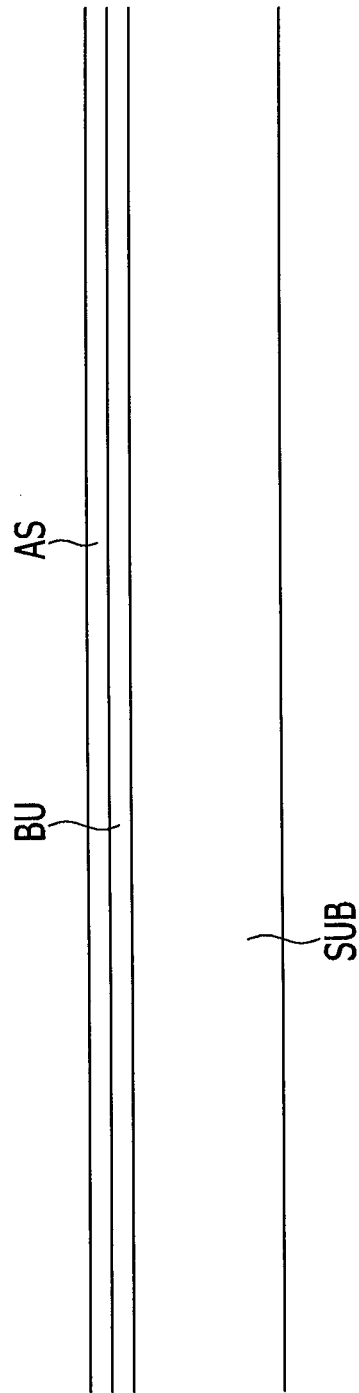

First, as shown in FIG. 1 through FIG. 3, an amorphous silicon layer AS is formed on a substrate SUB (S100). FIG. 3 is a cross-sectional view taken along the line III-III of FIG. 2.

The amorphous silicon layer AS may be formed by using a process such as sputtering and spin coating on the substrate SUB made of a glass material, an organic material, or a ceramic material. The amorphous silicon layer AS is formed with a plate shape and is made of amorphous silicon. Before forming the amorphous silicon layer AS, a buffer layer BU may be formed on the substrate SUB, and the buffer layer BU may be formed of a silicon nitride (SiNx) or a silicon oxide (SiOx).

Figure 4:
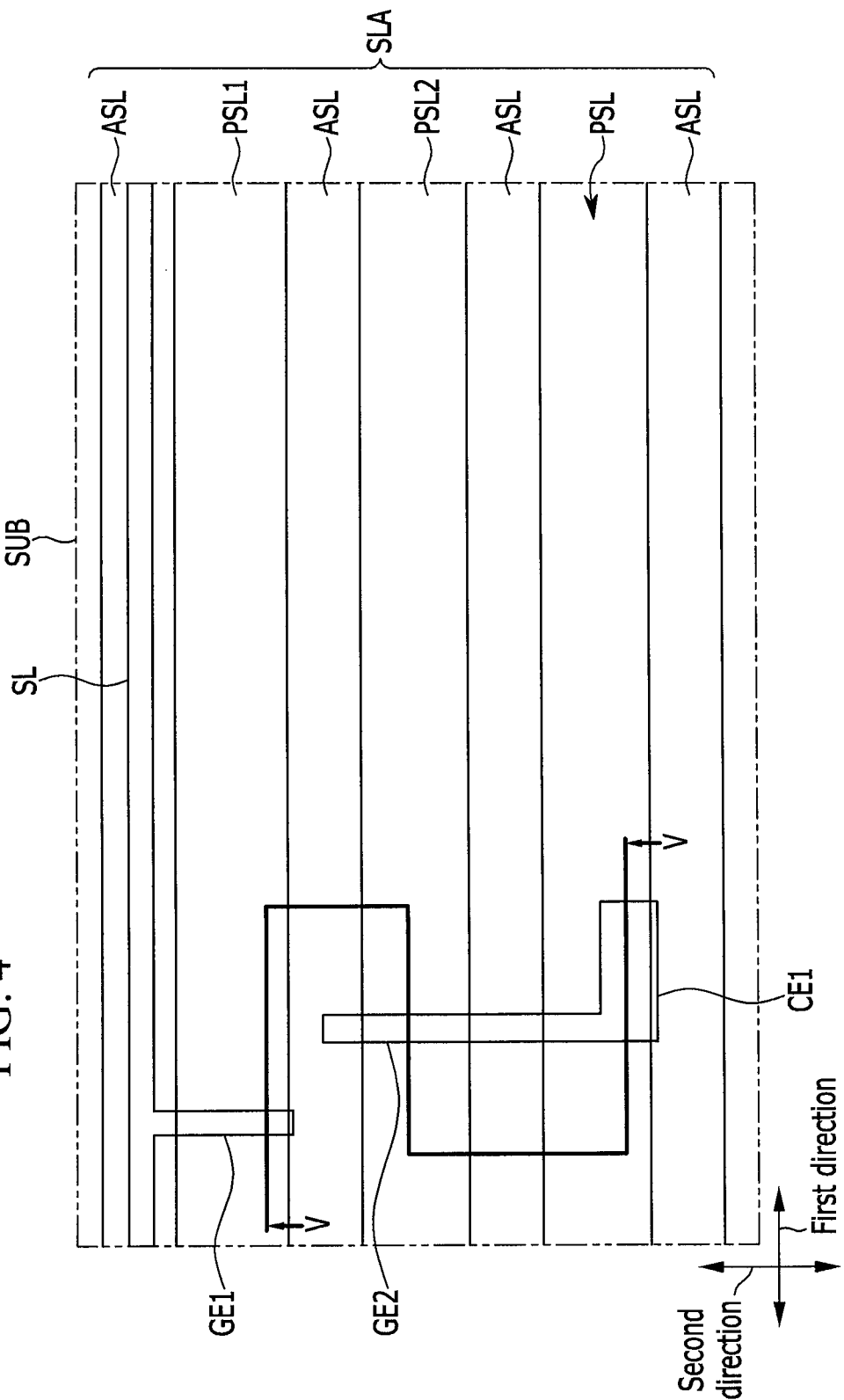
Figure 5:
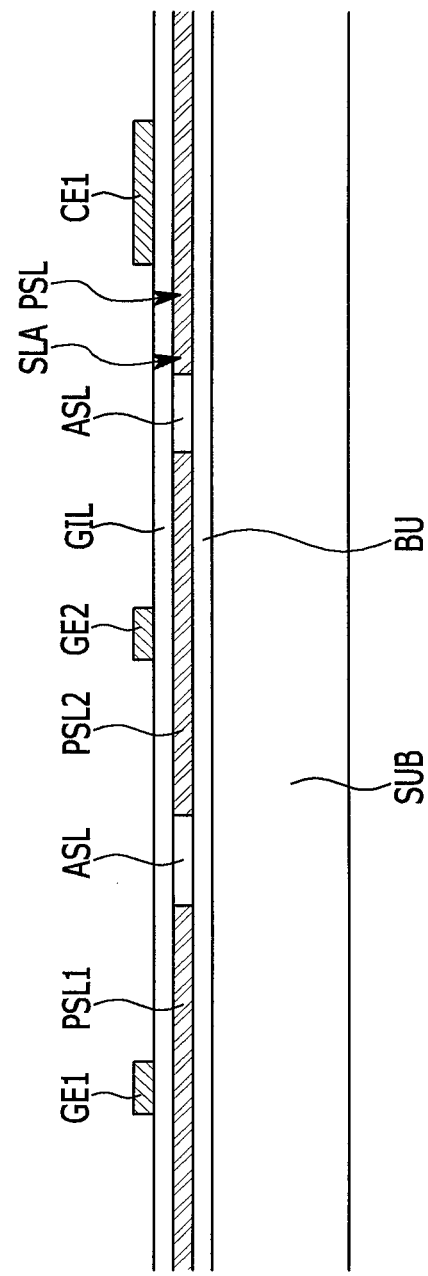

Next, as shown in FIG. 4 and FIG. 5, a laser is irradiated to the amorphous silicon layer to form a silicon layer SLA including a plurality of polysilicon lines PSL and a plurality of amorphous silicon lines (ASL) (S200). FIG. 5 is a cross-sectional view taken along the line V-V of FIG. 4.

The laser may be irradiated on to the amorphous silicon layer to crystallize the amorphous silicon positioned in the portion irradiated with the laser, thereby forming a plurality of polysilicon lines PSL spaced or spaced apart from each other and extending in a first direction. The width of each of the plurality of polysilicon lines PSL may be defined corresponding to a width of a laser beam. For example, the width of the laser beam may be 0.1 mm to 1.5 mm. That is, the plurality of polysilicon lines PSL are formed of polysilicon from the amorphous silicon by the laser.

While a plurality of polysilicon lines PSL are formed, the amorphous silicon line ASL is formed between the polysilicon lines PSL adjacent to and spaced from each other. That is, while the plurality of polysilicon lines PS are formed, the plurality of amorphous silicon lines ASL are simultaneously or concurrently formed. The plurality of amorphous silicon lines ASL are respectively positioned between the adjacent polysilicon lines PSL and extend in the first direction.

Accordingly, the silicon layer SLA including the plurality of polysilicon lines PSL and the plurality of amorphous silicon lines ASL is formed from the amorphous silicon layer. The silicon layer SLA is formed without patterning the amorphous silicon layer. That is, the plurality of polysilicon lines PSL and the plurality of amorphous silicon lines ASL are integrally formed thereby forming one silicon layer SLA. The amorphous silicon lines ASL connect adjacent polysilicon lines PSL.

Also, a gate insulating layer GIL made of a silicon nitride or a silicon oxide is formed on each of the first polysilicon line PSL1 and the second polysilicon line PSL2 among the plurality of polysilicon lines PSL that are spaced from each other, with the amorphous silicon line ASL therebetween, and a first gate electrode GE1 of a first thin film transistor and a second gate electrode GE2 of a second thin film transistor are formed on the gate insulating layer GIL. The first gate electrode GE1 and the second gate electrode GE2 extend in the second direction crossing the first direction, however, they are not limited thereto, and they may extend in various suitable directions.

Also, a scan line SL is formed through the same or substantially the same process of forming the first gate electrode GE1 and the second gate electrode GE2.

The scan line SL is positioned on the amorphous silicon line ASL adjacent to the first polysilicon line PSL1, and is connected to the first gate electrode GE1. The first gate electrode GE1 may be integrally formed with the scan line SL or may be connected to the scan line through a bridge. The scan line SL extends in the first direction, however it is not limited thereto, and it may extend in the second direction crossing the first direction.

Also, a first capacitor electrode CE1 is formed through the same or substantially the same process of forming the first gate electrode GE1, the second gate electrode GE2, and the scan line SL.

The first capacitor electrode CE1 may be positioned on the polysilicon line PSL or the amorphous silicon line ASL, and is connected to the second gate electrode GE2. The first capacitor electrode CE1 may be integrally formed with the second gate electrode GE2 or may be connected to the second gate electrode GE2 by the bridge.

The first gate electrode GE1, the second gate electrode GE2, the scan line SL, and the first capacitor electrode CE1 may be formed through micro electro mechanical systems (MEMS) such as a photolithography process from one gate metal layer. Here, the gate metal layer may be formed of a single layer or a plurality of layers. That is, the first gate electrode GE1, the second gate electrode GE2, the scan line SL, and the first capacitor electrode CE1 are formed of the same or substantially the same material.

Figure 6:
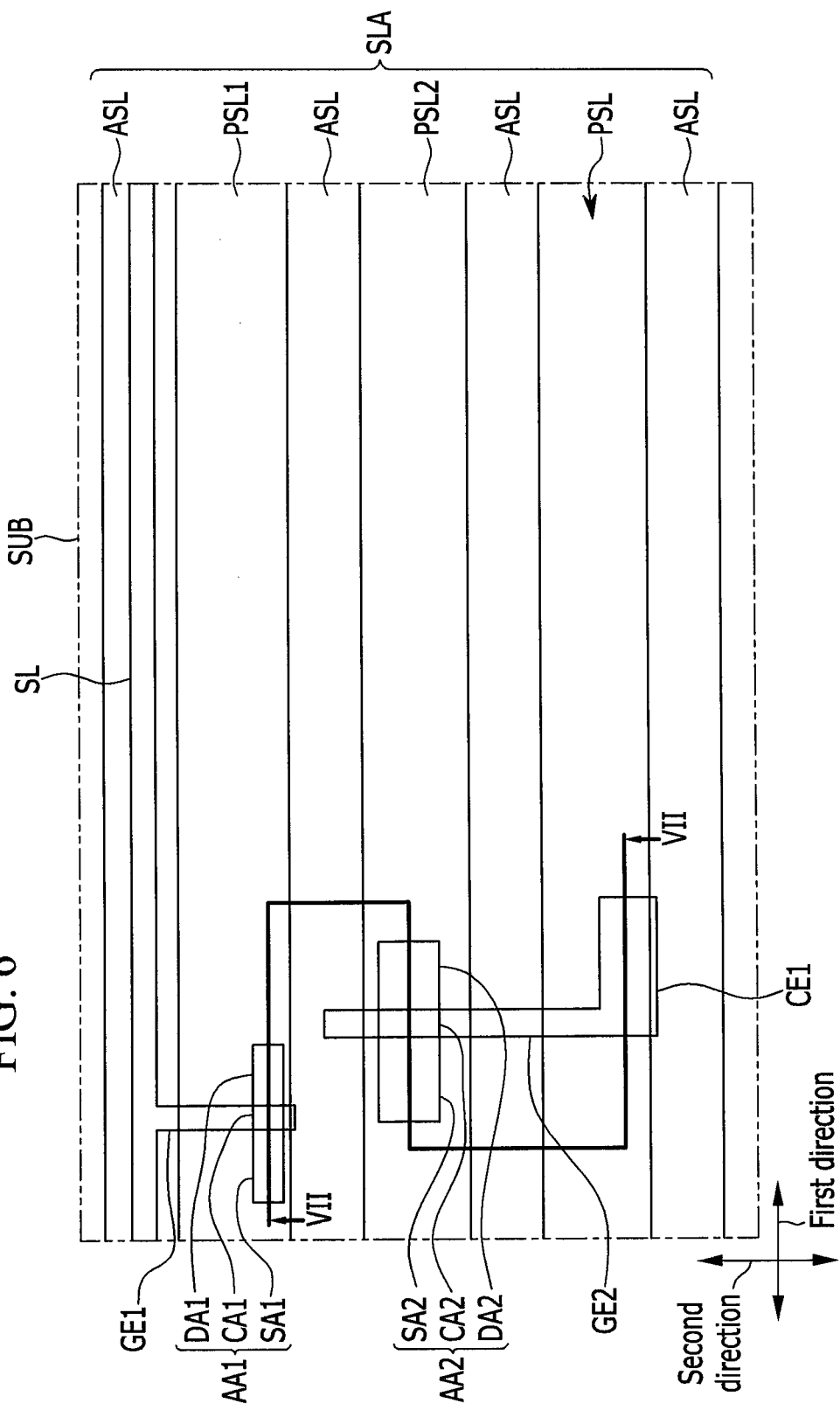
Figure 7:
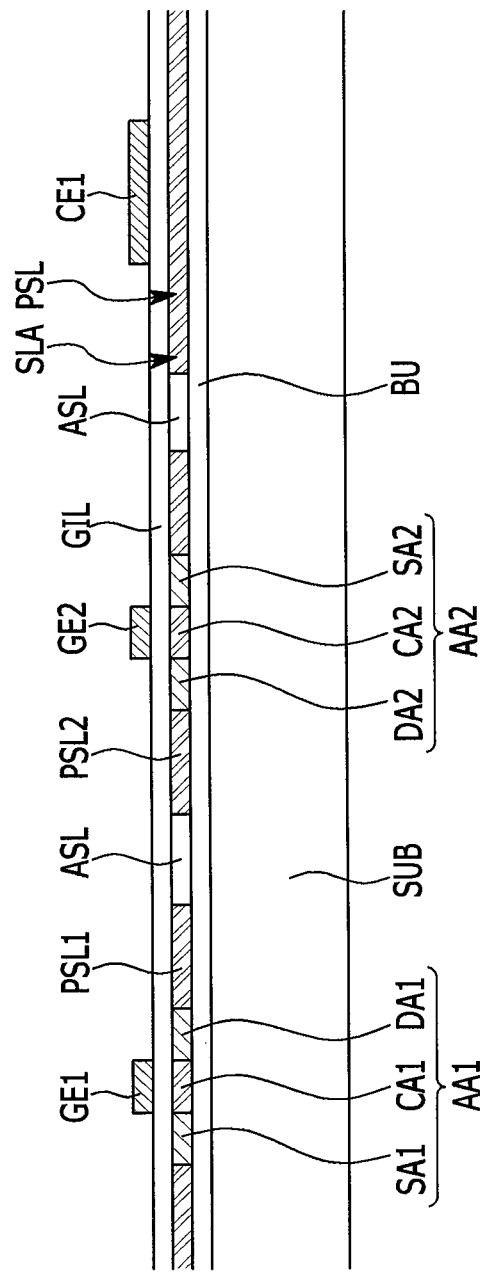

Next, as shown in FIG. 6 and FIG. 7, a first active region AA1 and a second active region AA2 are respectively formed at the different polysilicon lines PSL (S300). FIG. 7 is a cross-sectional view taken along the line VII-VII of FIG. 6.

In some embodiments, the first active region AA1 and the second active region AA2 are respectively formed at the first polysilicon line PSL1 and the second polysilicon line PSL2 spaced from each other as the different polysilicon lines PSL. The first active region AA1 and the second active region AA2 may be formed by doping an impurity to the first polysilicon line PSL1 and the second polysilicon line PSL2 respectively, using a mask.

On the other hand, in another exemplary embodiment of the present invention, the mask is not used and the impurity may be doped throughout the entire substrate SUB, and the entire silicon layer SLA may be doped with the impurity.

The first active region AA1 includes the first source region SA1 and the first drain region DA1 doped with the impurity and spaced from each other, and a first channel region CA1 positioned between the first source region SA1 and the first drain region DA1. The first gate electrode GE1 positioned on the first channel region CA1 serves as a mask in the described impurity doping process such that the first channel region CA1 is not doped with the impurity.

The second active region AA2 includes a second source region SA2 and a second drain region DA2 doped with the impurity and spaced from each other, and a second channel region CA2 positioned between the second source region SA2 and the second drain region DA2. The second gate electrode GE2 positioned on the second channel region CA2 serves as a mask in the described impurity doping process such that the second channel region CA2 is not doped with the impurity.

Figure 8:
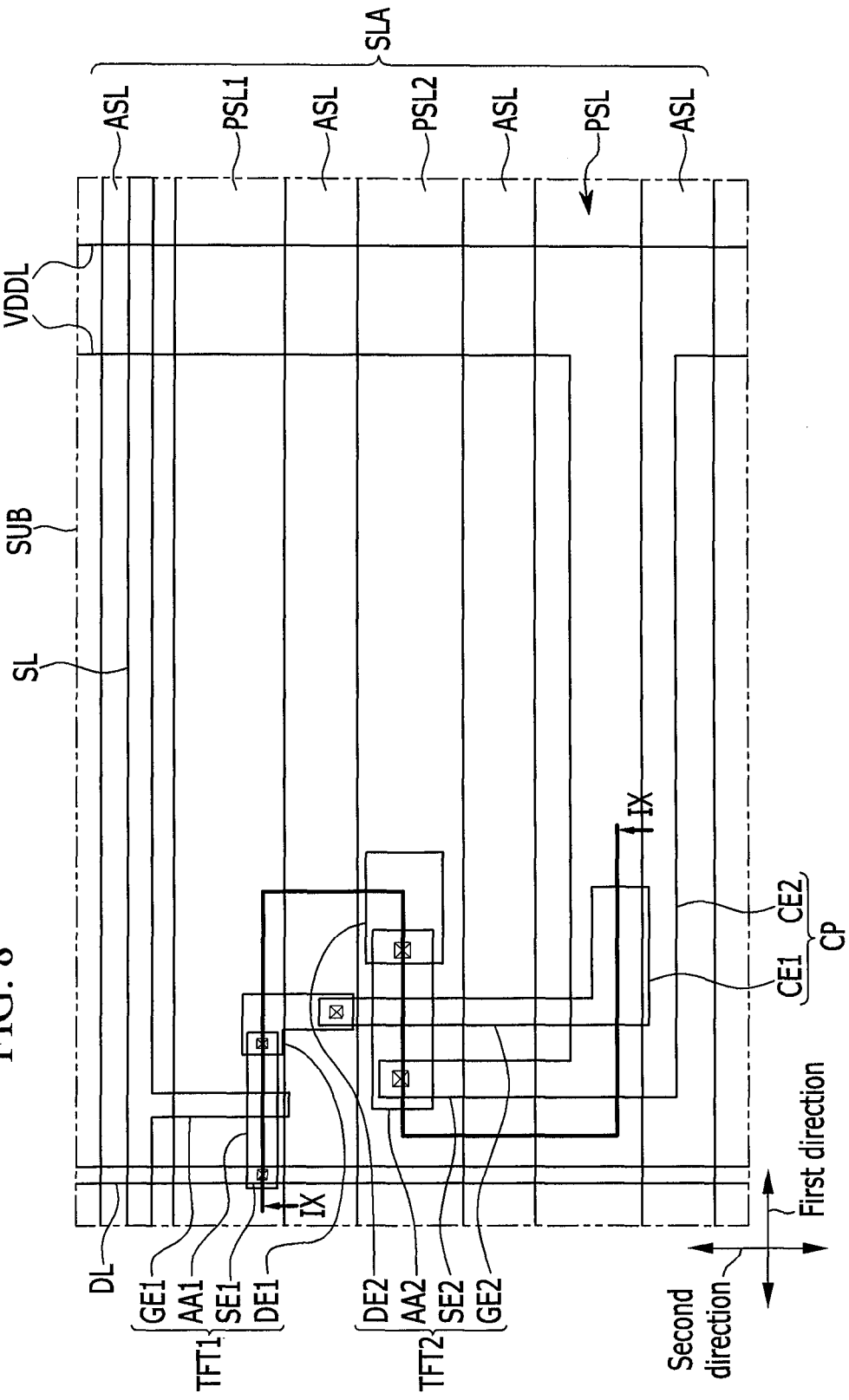
Figure 9:
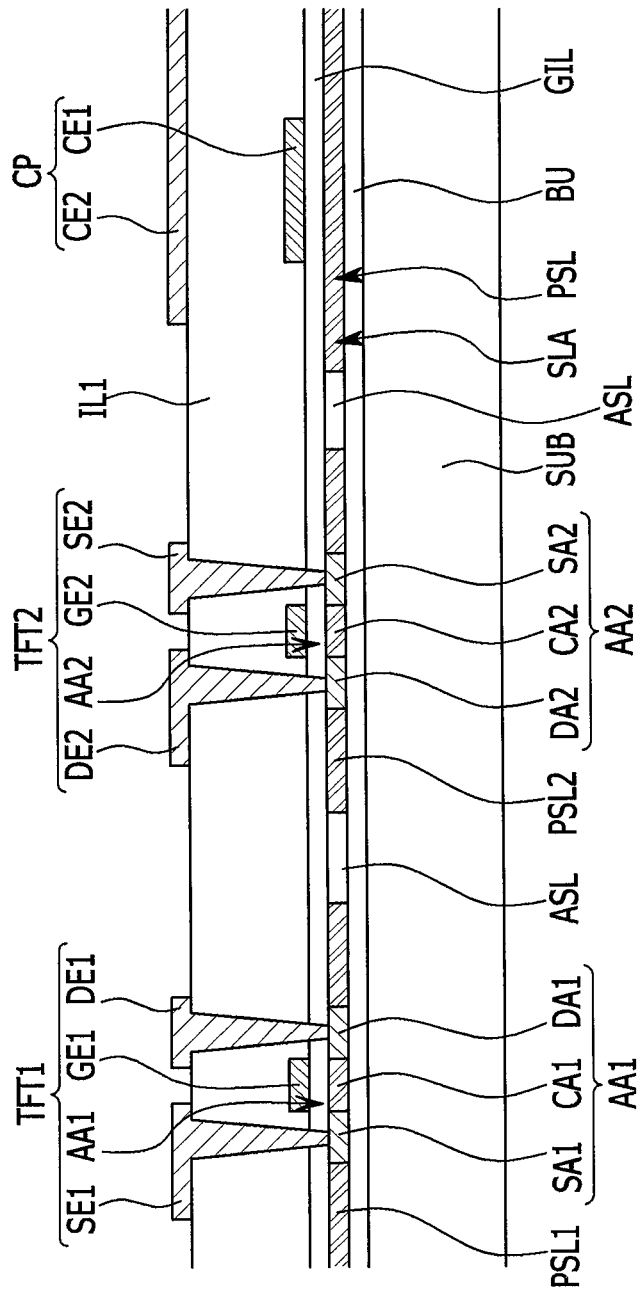

Next, as shown in FIG. 8 and FIG. 9, a first thin film transistor TFT1 and a second thin film transistor TFT2 are formed (S400). FIG. 9 is a cross-sectional view taken along the line IX-IX of FIG. 8.

The first insulating layer IL1 including the organic material or the inorganic material is formed on the first gate electrode GE1, the second gate electrode GE2, the scan line SL, and the first capacitor electrode CE1. After forming a contact hole, in the first insulating layer IL1, a data line DL, a first source electrode SE1, a first drain electrode DE1, a second source electrode SE2, a second drain electrode DE2, a second capacitor electrode CE2, and a driving power source line VDDL are formed on the first insulating layer IL1.

The data line DL is positioned on the silicon layer SLA, extends in the second direction, and is connected to the first source region SA1 through the first source electrode SE1.

The first source electrode SE1 is integrally formed with the data line DL, and is connected to the first source region SA1 through the contact hole of the first insulating layer IL1.

The first drain electrode DE1 is connected to the first drain region DA1 and is connected to the second gate electrode GE2.

The first source electrode SE1, the first drain electrode DE1, the first gate electrode GE1, and the first active region AA1 form the first thin film transistor TFT1.

The second source electrode SE2 is integrally formed with the driving power source line VDDL through the second capacitor electrode CE2, and is connected to the second source region SA2 through the contact hole of the first insulating layer IL1.

The second drain electrode DE2 is connected to the second drain region DA2 through the contact hole of the first insulating layer IL.

The second source electrode SE2, the second drain electrode DE2, the second gate electrode GE2, and the second active region AA2 form the second thin film transistor TFT2.

The second capacitor electrode CE2 is positioned on the first capacitor electrode CE1 with the first insulating layer IL1 therebetween, and the second capacitor electrode CE2 is integrally connected with the driving power source line VDDL and the second source electrode SE2.

The second capacitor electrode CE2 and the first capacitor electrode CE1 form a capacitor CP.

The driving power source line VDDL is positioned on the silicon layer SLA, and extends in the second direction to be connected to the second source region SA2 through the second capacitor electrode CE2 and the second source electrode SE2.

The data line DL, the first source electrode SE1, the first drain electrode DE1, the second source electrode SE2, the second drain electrode DE2, the second capacitor electrode CE2, and the driving power source line VDDL may be formed through the micro electro mechanical systems (MEMS) such as the photolithography process by using the same or substantially the same process from one data metal layer. Here, the data metal layer may be formed of a single layer or a plurality of layers. That is, the data line DL, the first source electrode SE1, the first drain electrode DE1, the second source electrode SE2, the second drain electrode DE2, the second capacitor electrode CE2, and the driving power source line VDDL are formed of the same or substantially the same material.

Figure 10:
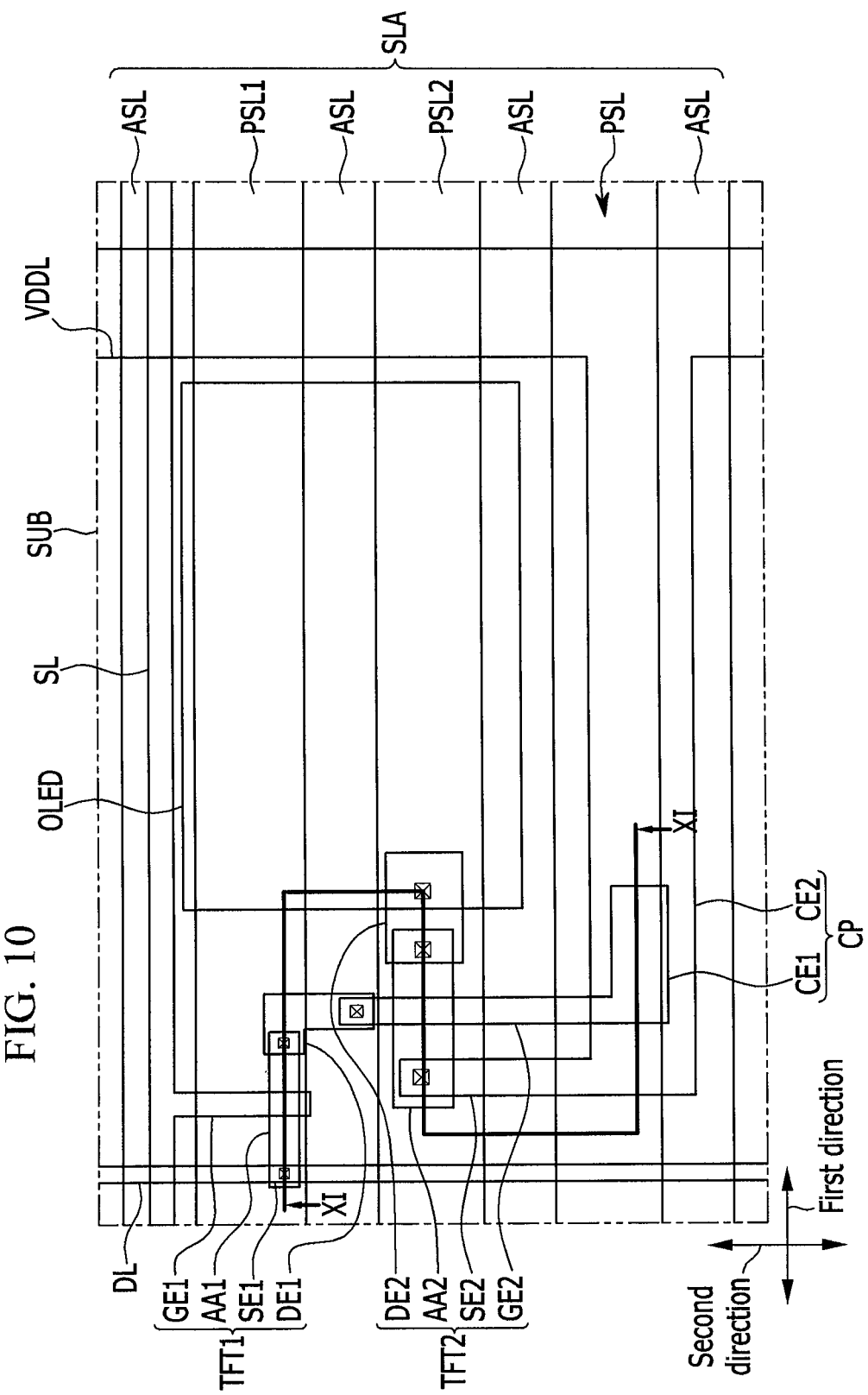
Figure 11:
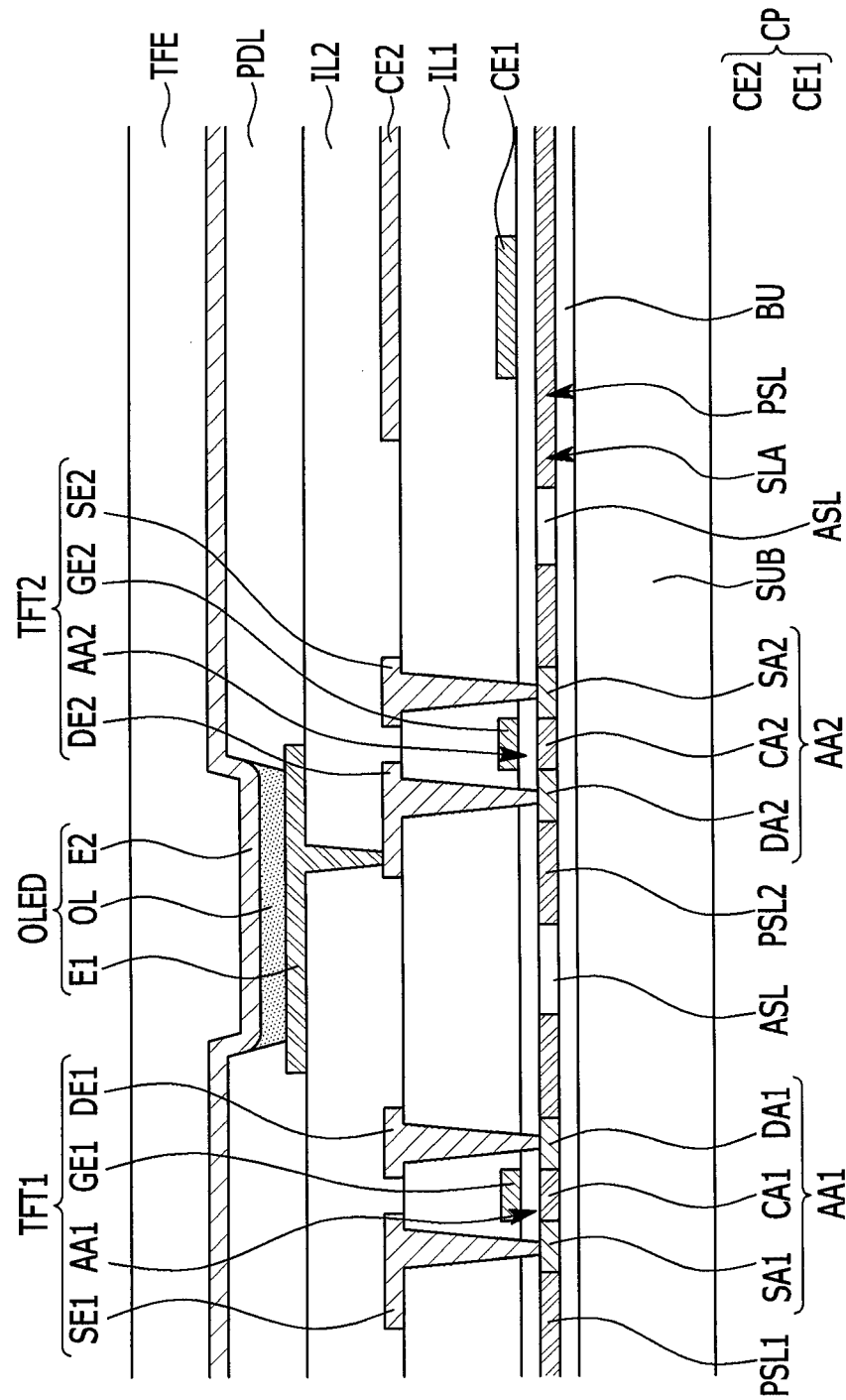

Next, as shown in FIG. 10 and FIG. 11, the organic light emitting element OLED is formed. FIG. 11 is a cross-sectional view taken along the line XI-XI of FIG. 10.

In some embodiments, a second insulating layer IL2 including the organic material or the inorganic material is formed on the data line DL, the first source electrode SE1, the first drain electrode DE1, the second source electrode SE2, the second drain electrode DE2, the second capacitor electrode CE2, and the driving power source line VDDL, and after forming a contact hole exposing the second drain electrode DE2 in the second insulating layer IL2. A first electrode E1 connected to the second drain electrode DE2 through the contact hole is formed on the second insulating layer IL2.

Also, a pixel definition layer PDL is formed to cover both ends of the first electrode E1. An organic emission layer OL is formed on the first electrode E1 exposed through the pixel definition layer PDL. A second electrode E2 is formed on the organic emission layer OL to form the organic light emitting element OLED. Here, at least one electrode of the first electrode E1 and the second electrode E2 may be formed of a light transmission electrode, a light reflection electrode, or a light translucent electrode. Accordingly, by connecting the first electrode E1 to the second drain electrode DE2 of the second thin film transistor TFT2, the organic light emitting element OLED is connected to the second thin film transistor TFT2.

Also, an encapsulation layer TFE is formed on the organic light emitting element OLED to manufacture the organic light emitting diode display. The encapsulation layer TFE may be formed as a thin film encapsulation layer, but it is not limited thereto, and an encapsulation substrate may be positioned on the encapsulation layer TFE, or an encapsulation layer TFE may be omitted and the encapsulation substrate may be positioned on the organic light emitting element OLED.

An organic light emitting diode display according to another exemplary embodiment of the present invention that will be described later is manufactured by the described manufacturing method of the organic light emitting diode display according to an exemplary embodiment of the present invention.

Next, the organic light emitting diode display according to another exemplary embodiment of the present invention is described with reference to FIG. 10 and FIG. 11.

FIG. 10 is a top plan view of a portion of an organic light emitting diode display according to another exemplary embodiment of the present invention, and FIG. 11 is a cross-sectional view taken along the line XI-XI of FIG. 10.

As shown in FIG. 10 and FIG. 11, the organic light emitting diode display according to another exemplary embodiment of the present invention includes the substrate SUB, the silicon layer SLA, the scan line SL, the first thin film transistor TFT1, the second thin film transistor TFT2, the capacitor CP, the data line DL, the driving power source line VDDL, the organic light emitting element OLED, and the encapsulation layer TFE.

The substrate SUB is formed of a glass material, an organic material, or a ceramic material. A silicon layer SLA is formed on the substrate SUB with a buffer layer BU, formed of a silicon nitride (SiNx) or a silicon oxide (SiOx), interposed therebetween.

The silicon layer SLA includes the plurality of polysilicon lines PSL extending in the first direction and spaced from each other and the plurality of amorphous silicon lines ASL extending in the first direction and positioned between the adjacent polysilicon lines PSL. The plurality of polysilicon lines PSL and the plurality of amorphous silicon lines ASL form one silicon layer SLA. The amorphous silicon line ASL connects the adjacent polysilicon lines PSL, and thereby the plurality of polysilicon lines PSL and the plurality of amorphous silicon lines ASL are integrally formed.

The plurality of polysilicon lines PSL include the first polysilicon line PSL1 formed with the first active region AA1 and the second polysilicon line PSL2 formed with the second active region AA2 and spaced from the first polysilicon line PSL1 with the amorphous silicon line ASL interposed therebetween.

The first active region AA1 includes the first source region SA1 and the first drain region DA1 doped with the impurity and spaced from each other, and the first channel region CA1 positioned between the first source region SA1 and the first drain region DA1.

The second active region includes the second source region SA2 and the second drain region DA2 doped with the impurity and spaced from each other, and the second channel region CA2 positioned between the second source region SA2 and the second drain region DA2.

The scan line SL is positioned on the amorphous silicon line ASL adjacent to the first polysilicon line PSL1, extends in the first direction, and is connected to the first gate electrode GE1.

The first thin film transistor TFT1 includes the first gate electrode GE1, the first active region AA1, the first source electrode SE1, and the first drain electrode DE1. The first gate electrode GE1 is positioned on the first channel region CA1.

The second thin film transistor TFT2 includes the second gate electrode GE2, the second active region AA2, the second source electrode SE2, and the second drain electrode DE2. The second gate electrode GE2 is positioned on the second channel region CA2.

The capacitor CP includes the first capacitor electrode CE1 connected to the second gate electrode GE2 and the second capacitor electrode CE2 positioned on the first capacitor electrode CE1 with the first insulating layer IL1 therebetween and the second capacitor electrode CE2 is connected to the driving power source line VDDL.

The data line DL is positioned on the first insulating layer IL1 positioned on the silicon layer SLA, extends in the second direction, and is connected to the first source region SA1 through the first source electrode SE1.

The driving power source line VDDL is positioned on the first insulating layer IL1 positioned on the silicon layer SLA, extends in the second direction, and is connected to the second source region SA2 through the second capacitor electrode CE2 and the second source electrode SE2.

The organic light emitting element OLED is connected to the second thin film transistor TFT2, and includes the first electrode E1, the organic emission layer OL, and the second electrode E2 that are sequentially deposited.

The encapsulation layer TFE is positioned on the organic light emitting element OLED, and may be formed of a deposition structure in which at least one organic layer and at least one inorganic layer are alternately deposited or a single structure of the organic layer or the inorganic layer.

As described above, in the organic light emitting diode display according to another exemplary embodiment of the present invention, the first active region AA1 of the first thin film transistor TFT1 and the second active region AA2 of the second thin film transistor TFT2 are respectively formed in the first polysilicon line PSL1 and the second polysilicon line PSL2 such that it is not necessary to pattern the active region included in the plurality of thin film transistors.

In the organic light emitting diode display according to another exemplary embodiment of the present invention, the first active region AA1 of the first thin film transistor TFT1 and the second active region AA2 of the second thin film transistor TFT2 are respectively formed in the first polysilicon line PSL1 and the second polysilicon line PSL2, and the amorphous silicon line ASL having high resistance compared with the polysilicon is positioned between the first polysilicon line PSL1 and the second polysilicon line PSL2, thereby preventing or substantially preventing the undesired current from flowing between the first active region AA1 and the second active region AA2 respectively included in the first thin film transistor TFT1 and the second thin film transistor TFT2.

In the organic light emitting diode display according to another exemplary embodiment of the present invention, the scan line SL is positioned on the amorphous silicon line ASL having the high resistance compared with the polysilicon, and since the undesired capacitance is prevented or substantially prevented from flowing between the scan line SL and the amorphous silicon line ASL, the current flowing to the scan line SL is suppressed from being delayed by the capacitance.

In the manufacturing method of the organic light emitting diode display according to an exemplary embodiment of the present invention, the first active region AA1 and the second active region AA2 are respectively formed in the first polysilicon line PSL1 and the second polysilicon line PSL2 of the silicon layer SLA that is not patterned, thereby reducing the manufacturing cost and the manufacturing time of the organic light emitting diode display.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. An organic light emitting diode display comprising:
   a substrate;
   a first thin film transistor comprising:
      a first active region on the substrate;
   a second thin film transistor connected to the first thin film transistor and comprising:
      a second active region spaced from the first active region; and
   a silicon layer on the substrate and comprising:
      a plurality of polysilicon lines spaced from each other and extending in a first direction; and
      a plurality of amorphous silicon lines between adjacent polysilicon lines and extending in the first direction and physically contacting the adjacent polysilicon lines,
   wherein the first active region and the second active region are in different polysilicon lines of the plurality of polysilicon lines.

2. The organic light emitting diode display of claim 1, wherein the plurality of polysilicon lines and the plurality of amorphous silicon lines form one silicon layer.

3. The organic light emitting diode display of claim 2, wherein the plurality of polysilicon lines and the plurality of amorphous silicon lines are integrally formed.

4. The organic light emitting diode display of claim 3, wherein the amorphous silicon lines connect adjacent polysilicon lines.

5. The organic light emitting diode display of claim 1, wherein the plurality of polysilicon lines comprise:
   a first polysilicon line formed with the first active region; and
   a second polysilicon line spaced from the first polysilicon line with the amorphous silicon line interposed therebetween and formed with the second active region.

6. The organic light emitting diode display of claim 5, wherein the first active region comprises:
   a first source region doped with an impurity;
   a first drain region spaced from the first source region and doped with the impurity; and
   a first channel region between the first source region and the first drain region.

7. The organic light emitting diode display of claim 6, wherein the second active region comprises:
   a second source region doped with the impurity;
   a second drain region spaced from the second source region and doped with the impurity; and
   a second channel region between the second source region and the second drain region.

8. The organic light emitting diode display of claim 7, wherein the first thin film transistor further comprises:
   a first gate electrode on the first channel region, and
   wherein the second thin film transistor further comprises:
   a second gate electrode on the second channel region and connected to the first drain region.

9. The organic light emitting diode display of claim 8, wherein the first gate electrode and the second gate electrode respectively extend in a second direction crossing the first direction.

10. The organic light emitting diode display of claim 9, further comprising:
    a scan line on the first polysilicon line and the adjacent amorphous silicon line, extending in the first direction, and connected to the first gate electrode.

11. The organic light emitting diode display of claim 10, further comprising:
    a data line on the silicon layer, extending in the second direction, and connected to the first source region.

12. The organic light emitting diode display of claim 11, further comprising
    a driving power source line on the silicon layer, extending in the second direction, and connected to the second source region.

13. The organic light emitting diode display of claim 12, further comprising:
    a capacitor comprising:
       a first capacitor electrode connected to the second gate electrode; and
       a second capacitor electrode on the first capacitor electrode with an insulating layer therebetween and the second capacitor electrode is connected to the driving power source line.

14. The organic light emitting diode display of claim 13, wherein the first capacitor electrode is formed of a same material as the second gate electrode, and
    wherein the second capacitor electrode is formed of a same material as the driving power source line.

15. The organic light emitting diode display of claim 1, wherein the plurality of polysilicon lines are formed of polysilicon generated from amorphous silicon using a laser.

16. The organic light emitting diode display of claim 1, further comprising:
    an organic light emitting element connected to the second thin film transistor.

17. The organic light emitting diode display of claim 16, wherein the organic light emitting element comprises:
    a first electrode connected to the second thin film transistor;
    an organic emission layer on the first electrode; and
    a second electrode on the organic emission layer.

* * * * *